United States Patent
Oganesian et al.

(10) Patent No.: US 10,139,619 B2
(45) Date of Patent: Nov. 27, 2018

(54) BACK SIDE ILLUMINATION IMAGE SENSOR WITH NON-PLANAR OPTICAL INTERFACE

(71) Applicant: Optiz, Inc., Palo Alto, CA (US)

(72) Inventors: Vage Oganesian, Sunnyvale, CA (US); Zhenhua Lu, East Palo Alto, CA (US)

(73) Assignee: OPTIZ, INC., Palo Alto, CA (US)

( * ) Notice: Subject to any disclaimer, the term of this patent is extended or adjusted under 35 U.S.C. 154(b) by 13 days.

(21) Appl. No.: 14/621,324

(22) Filed: Feb. 12, 2015

(65) Prior Publication Data
US 2016/0238836 A1    Aug. 18, 2016

(51) Int. Cl.
| | |
|---|---|
| H04N 9/07 | (2006.01) |
| G02B 27/00 | (2006.01) |
| H01L 27/146 | (2006.01) |
| H04N 5/369 | (2011.01) |
| G02B 3/00 | (2006.01) |
| G02B 5/20 | (2006.01) |
| H04N 5/225 | (2006.01) |

(52) U.S. Cl.
CPC .......... *G02B 27/005* (2013.01); *G02B 3/0043* (2013.01); *G02B 3/0056* (2013.01); *G02B 5/201* (2013.01); *H01L 27/1464* (2013.01); *H01L 27/14605* (2013.01); *H01L 27/14607* (2013.01); *H01L 27/14627* (2013.01); *H04N 5/3696* (2013.01)

(58) Field of Classification Search
CPC ......... H01L 27/14618; H01L 27/14683; H01L 24/97; H01L 2924/15788; H01L 2224/16; H01L 2924/3511; H01L 2924/00; H04N 5/2253; H04N 5/2257; H04N 5/335; H04N 5/3696
See application file for complete search history.

(56) References Cited

U.S. PATENT DOCUMENTS

| | | |
|---|---|---|
| 5,595,930 A | 1/1997 | Baek |
| 6,486,917 B2 | 11/2002 | Iwasaki |
| 6,556,349 B2 | 4/2003 | Cox et al. |

(Continued)

FOREIGN PATENT DOCUMENTS

| | | |
|---|---|---|
| CN | 102194848 | 9/2011 |
| CN | 103811505 | 5/2014 |

(Continued)

OTHER PUBLICATIONS

Kidera et al. Apr. 1994 JP 06-118209 A (English Machine Translation), Detailed Description.*

*Primary Examiner* — Twyler Haskins
*Assistant Examiner* — Carramah J Quiett
(74) *Attorney, Agent, or Firm* — DLA Piper LLP (US)

(57) ABSTRACT

An image sensor that includes a substrate having front and back surfaces, a plurality of photo detectors formed adjacent the front surface, a plurality of contact pads at the front surface and electrically coupled to the photo detectors, and a plurality of light manipulation components disposed on a portion of the back surface. The photo detectors are configured to generate electrical signals in response to light incident through the light manipulation components and through the portion of the back surface. The portion of the back surface has a non-planar shape.

12 Claims, 12 Drawing Sheets

(56) References Cited

U.S. PATENT DOCUMENTS

| | | | |
|---|---|---|---|
| 7,923,793 B2* | 4/2011 | Choi | ................ H01L 27/14618 |
| | | | 250/208.1 |
| 8,675,118 B2 | 3/2014 | Ryu et al. | |
| 8,692,344 B2 | 4/2014 | Oganesian | |
| 8,742,527 B2 | 6/2014 | Suzuki et al. | |
| 8,932,894 B2 | 1/2015 | Christophersen | |
| 2012/0299140 A1* | 11/2012 | Sekine | .............. H01L 27/14607 |
| | | | 257/432 |
| 2013/0075849 A1 | 3/2013 | Suzuki et al. | |
| 2013/0242155 A1* | 9/2013 | Oganesian | ............. H04N 5/374 |
| | | | 348/308 |

FOREIGN PATENT DOCUMENTS

| | | |
|---|---|---|
| JP | 06-118209 A | 4/1994 |
| JP | 06118209 A * | 4/1994 |
| JP | 2002-094037 A | 3/2002 |
| JP | 2005-175430 A | 6/2005 |
| JP | 2006-128513 A | 5/2006 |
| JP | 2006-134911 A | 5/2006 |
| JP | 2006-196503 A | 7/2006 |
| JP | 2008-182185 A | 8/2008 |
| JP | 2009-088030 A | 4/2009 |
| JP | 2009-232392 | 10/2009 |
| JP | 2009 259934 A | 11/2009 |
| JP | 2012 114189 A | 6/2012 |
| KR | 10-2013-0105491 | 9/2013 |
| KR | 10-2015-0004294 | 1/2015 |
| TW | I 254156 | 5/2006 |

* cited by examiner

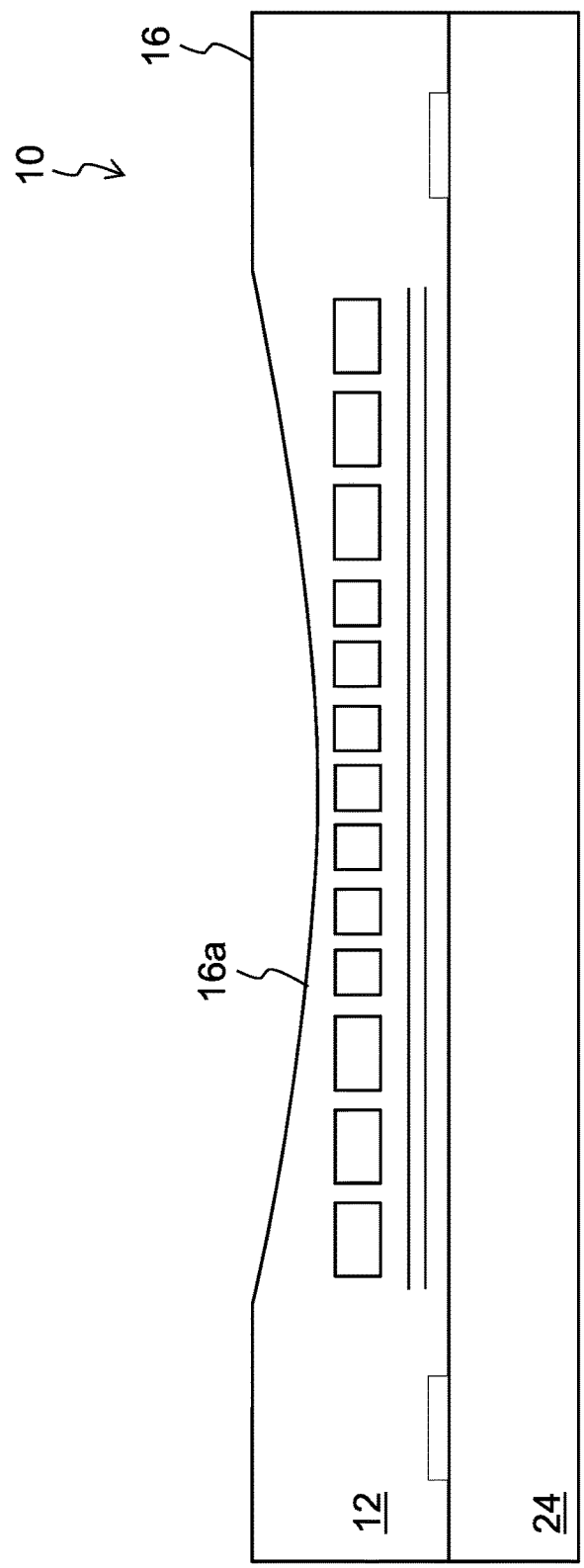

BACK SIDE ILLUMINATION IMAGE SENSOR WITH NON-PLANAR OPTICAL INTERFACE

FIELD OF THE INVENTION

The present invention relates to image sensors, and more particularly to Back Side Illumination (BSI) image sensors.

BACKGROUND OF THE INVENTION

Compact image sensor devices used in camera modules are well known in the art. One or more lenses are used to focus light onto the image sensor surface. Lenses can also be used for functions such as zoom in, zoom out, focus adjustment, wide-angle and many other optical effects. However, lenses can also introduce different types of optical aberrations. One optical aberration in particular is the Petzval Field Curvature, in which a flat object normal to the optical axis cannot be brought into focus onto a flat image sensor. One or more additional field curvature correction elements would need to be introduced in the lens stack to counteract the field curvature of an optical system.

FIG. 1 illustrates a conventional image sensor system 1 without any focus plane correction optical elements. The image sensor system 1 include a lens 2 that focuses light onto an image sensor 3. The focus plane 4 of lens 2 is actually not perfectly planar, but rather is slightly curved, so that when light in the center of the system 1 is properly focused onto the image sensor 3, light away from the center axis of the lens is focused slightly above the image sensor 3. This aberration degrades the quality of the image being captured by the image sensor.

One solution to correct for this type of aberration is to add one or more field curvature correction elements to the lens stack, so that the focus plane 4 is planar and located at the planar surface of the image sensor 3. One example of a curvature correction element is a field flattener lens 5, as shown in FIG. 2. However, using curvature correction elements increases the complexity of the optical system, increases the optical system height, introduces an additional point of failure (e.g. the aberration correction element can be misaligned, have uneven surface, etc.), can introduce additional distortion, can decrease brightness, and possibly results in other negative effects.

Another solution is to reconfigure the image sensor to better match a curved focus plane so that the number of optical elements in the lens stack can be reduced. For example, U.S. Pat. No. 6,556,349 discloses using a transparent substrate over the image sensor with varied sizes or heights of the micro lenses above each photo detector. U.S. Pat. Nos. 6,486,917 and 7,923,793 disclose bending and bonding the image sensor to a concave surface. These solutions, however, introduce other problems such as crosstalk, structure height, reduced thermal stress tolerance, special fabrication tooling requirements, reduced three-dimensional integrated circuit (3D IC) capabilities, etc.

BRIEF SUMMARY OF THE INVENTION

The aforementioned problems and needs are addressed by an image sensor that includes a substrate having front and back surfaces, a plurality of photo detectors formed adjacent the front surface, a plurality of contact pads at the front surface and electrically coupled to the photo detectors, and a plurality of light manipulation components disposed on a portion of the back surface. The photo detectors are configured to generate electrical signals in response to light incident through the light manipulation components and through the portion of the back surface. The portion of the back surface has a non-planar shape.

Other objects and features of the present invention will become apparent by a review of the specification, claims and appended figures.

BRIEF DESCRIPTION OF THE DRAWINGS

FIGS. 3A-3E are side cross section views showing the process steps in forming the image sensor of the present invention.

DETAILED DESCRIPTION OF THE INVENTION

The present invention is an image sensor and method of manufacture of the image sensor that reduces aberrations without requiring any additional optical elements. FIGS. 3A-3E illustrate the steps of forming the image sensor.

Figure 1:
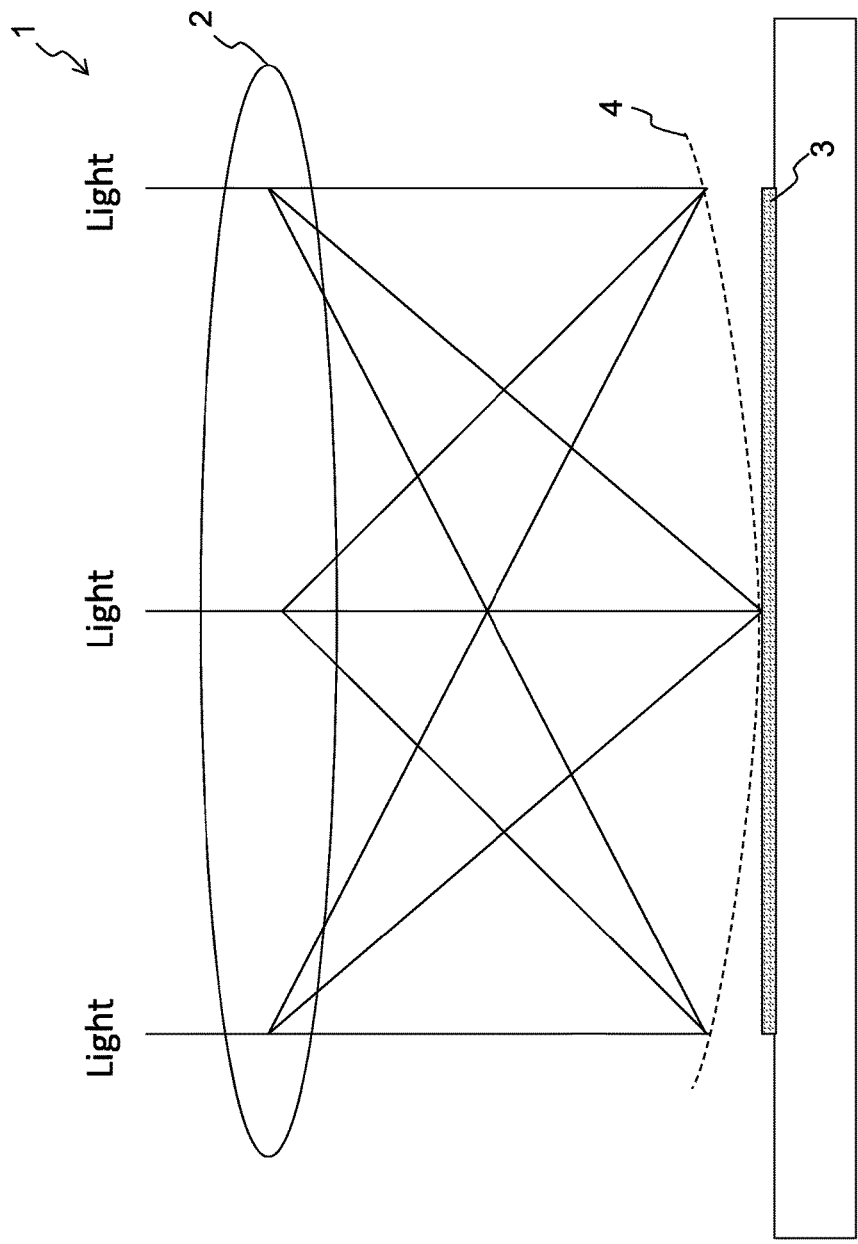
FIG. 1 is a side cross sectional view of a conventional image sensor.
Figure 2:
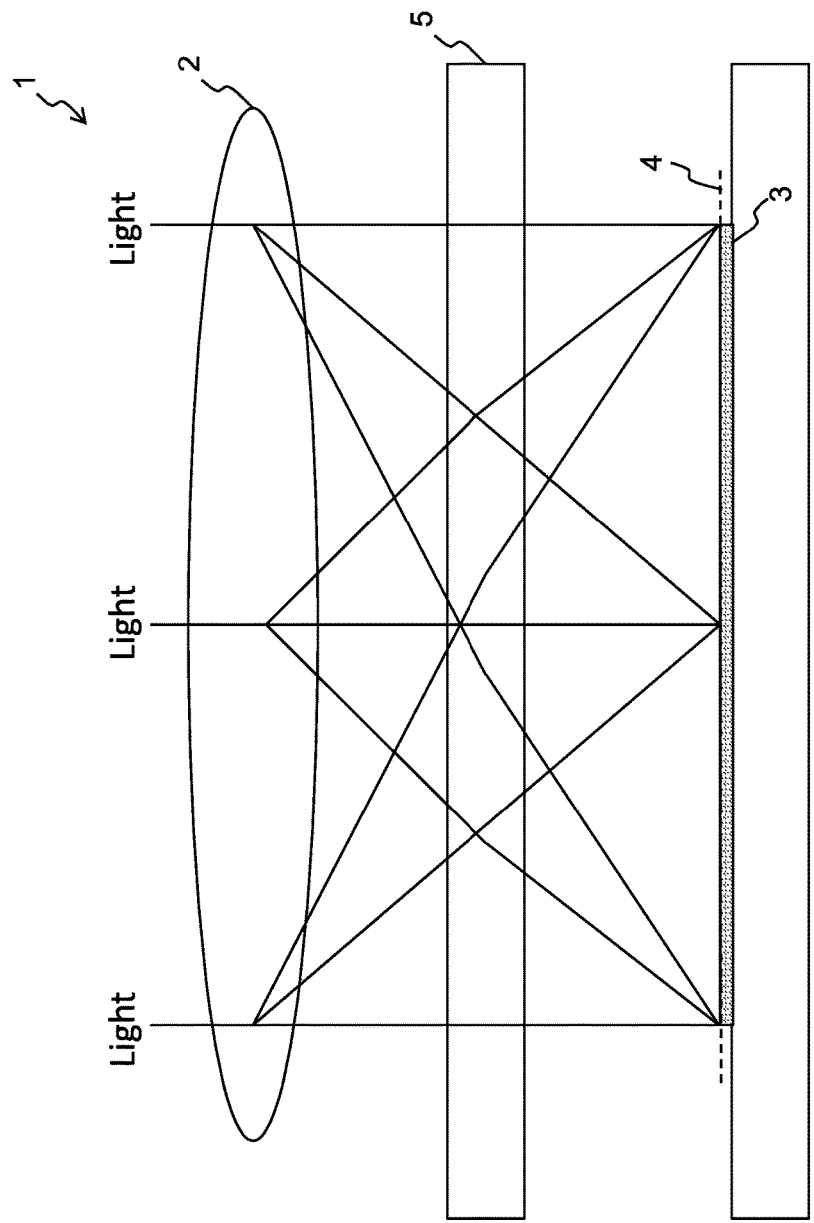
FIG. 2 is a side cross sectional view of a conventional image sensor with a field flattener lens.
Figure 3A:
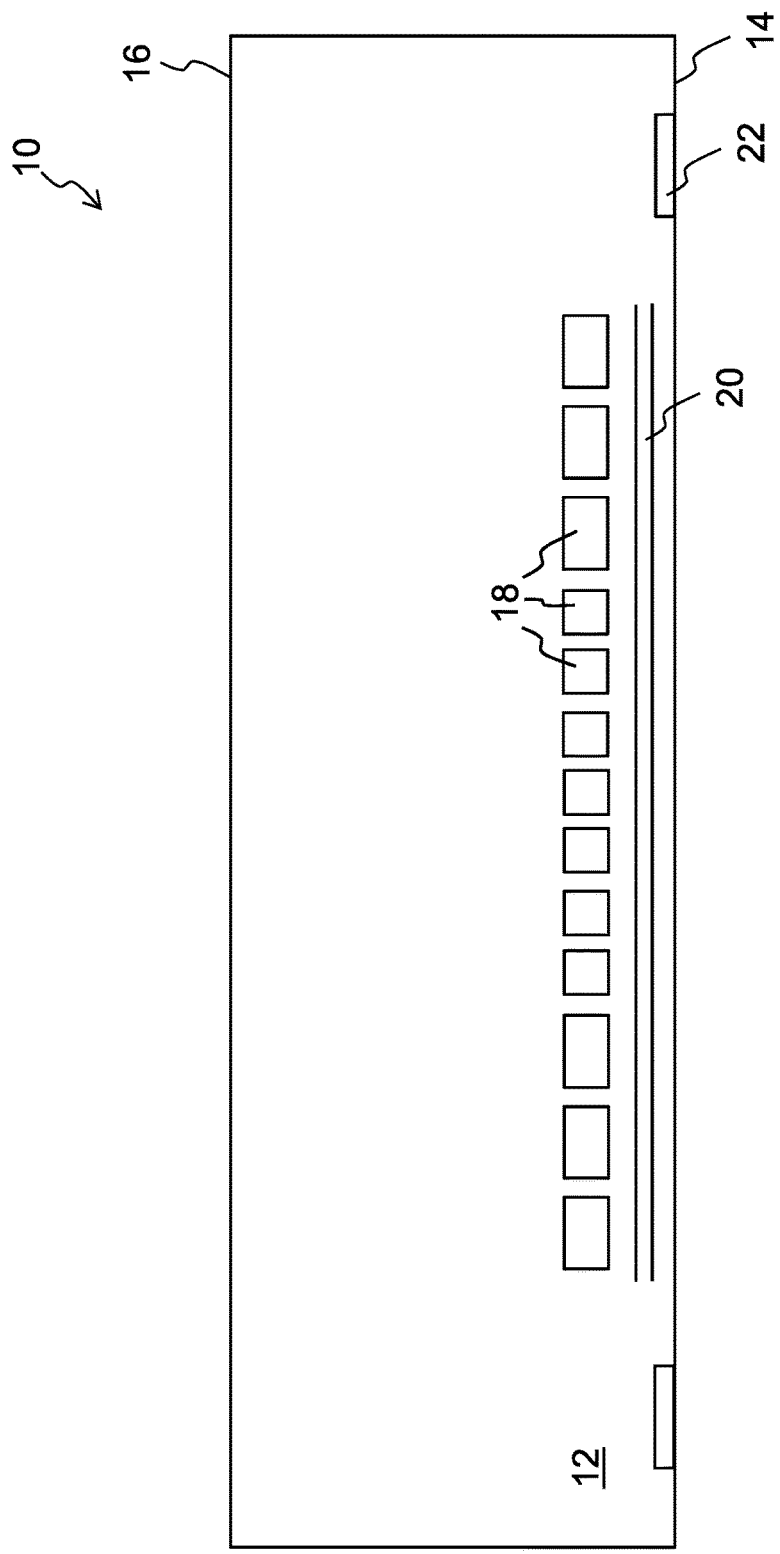

FIG. 3A illustrates the starting structure, which is a conventional image sensor wafer. It should be understood that while only one image sensor 10 is shown, a plurality of image sensors 10 are formed on a single wafer at one time, where the wafer is later singulated into individual sensor die each containing one of the image sensors 10. The image sensor 10 includes a substrate (e.g. silicon) 12 having opposing front and back surfaces 14 and 16 respectively. A plurality of photo detectors 18 (e.g. photo diodes) are formed adjacent the front surface 14, and configured to generate electrical signals in response to light received through the back surface 16. Electrical circuitry 20 is formed adjacent the photo detectors 18 for operating the photo detectors and/or providing the electrical signals from the photo detectors 18 to bond pads 22 formed at the front surface 14 for off chip conductivity. The photo detectors 18 are configured in a two dimensional array, preferably but not necessarily with the detectors 18 having varying lateral dimension sizes. Any photo detector size variation can be random or pseudo-random. As shown in FIG. 3A, the photo detectors 18 in the center of the array have a smaller lateral dimension than the detectors 18 at or near the periphery of the array. Image sensors 10 of the type shown in FIG. 3A are well known in the art and are commonly referred to as Back Side Illumination (BSI) sensors because the photo detectors are configured to detect and measure light entering through the back surface 16 of substrate 12 as opposed to the front surface 14.

Figure 3B:
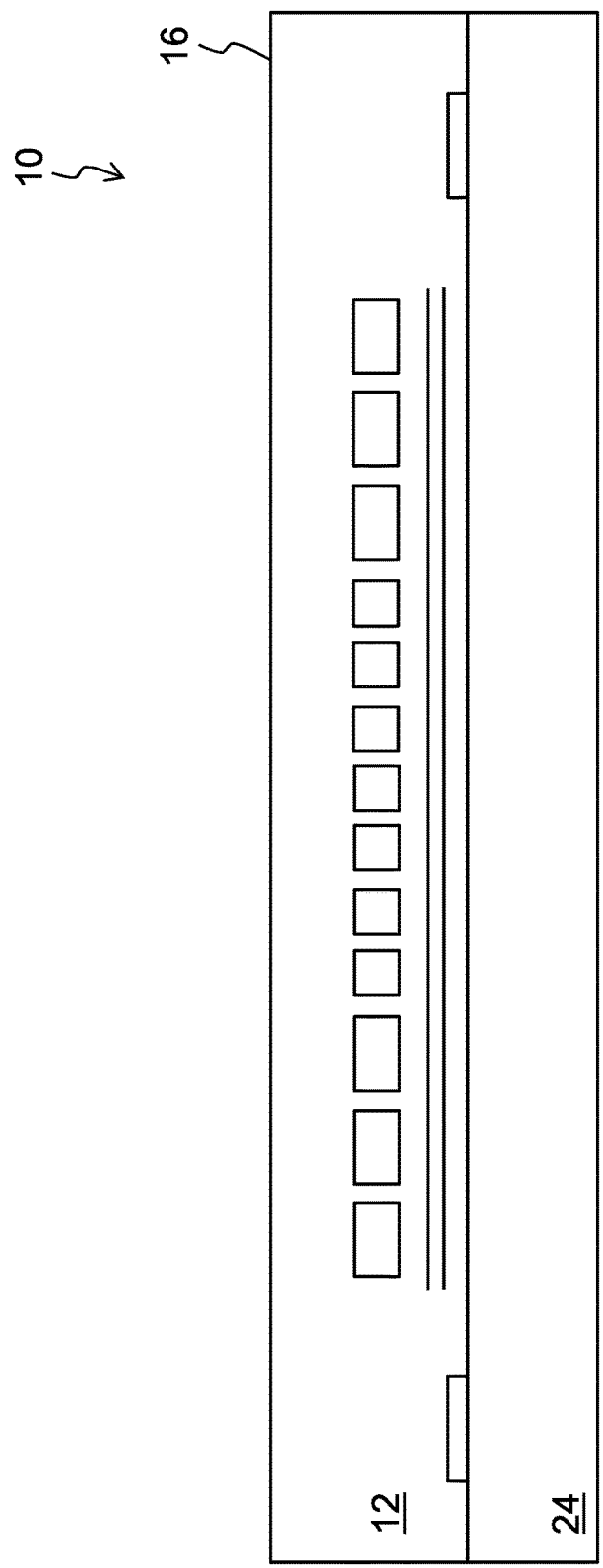

A handler substrate 24 is attached to the front surface 14 of substrate 12. The handler 24 can be ceramic or a crystalline silicon material. The handler substrate 24 can optionally contain additional components such as transistors, circuit layer(s), and interconnect(s). These optional features can be formed in the permanent handler before or after the attachment to the image sensor wafer. The thickness of substrate 12 can be reduced using mechanical grinding, chemical mechanical polishing (CMP), wet etching, atmospheric downstream plasma (ADP), dry chemical etching (DCE), or a combination of aforementioned processes or any another appropriate silicon thinning method(s), applied to the back surface 16. The handler substrate can also be thinned in this manner if desired. The resulting structure is shown in FIG. 3B.

The back surface 16 is then selectively etched to form a curved concave portion 16a of surface 16 which will serve as an optical interface that is compatible with the lens stack's optical design that is attached later. The lens stack optical design (discussed below) will dictate the optimal shape of this interface. The curved surface portion 16a can be formed by deposition of photoresist, patterning of the photoresist and then etching the exposed silicon. The patterning and etching process can be repeated multiple times to achieve the desired profile of surface portion 16a. The resulting structure is shown in FIG. 3C.

Figure 3D:
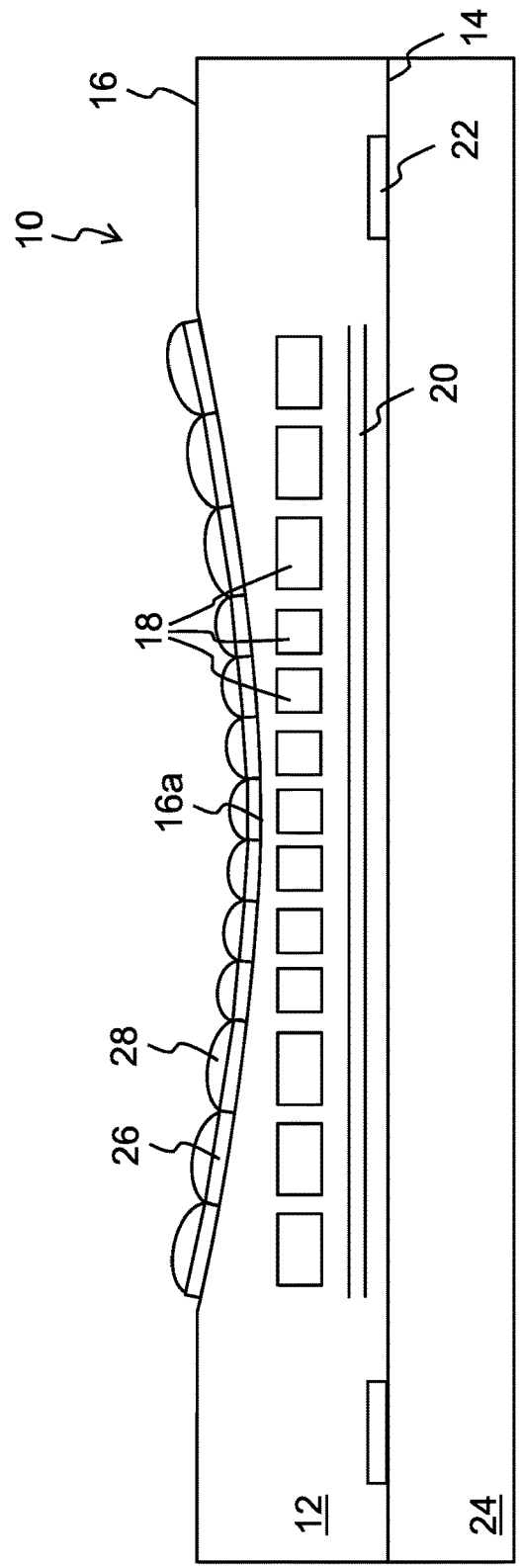
Figure 3E:
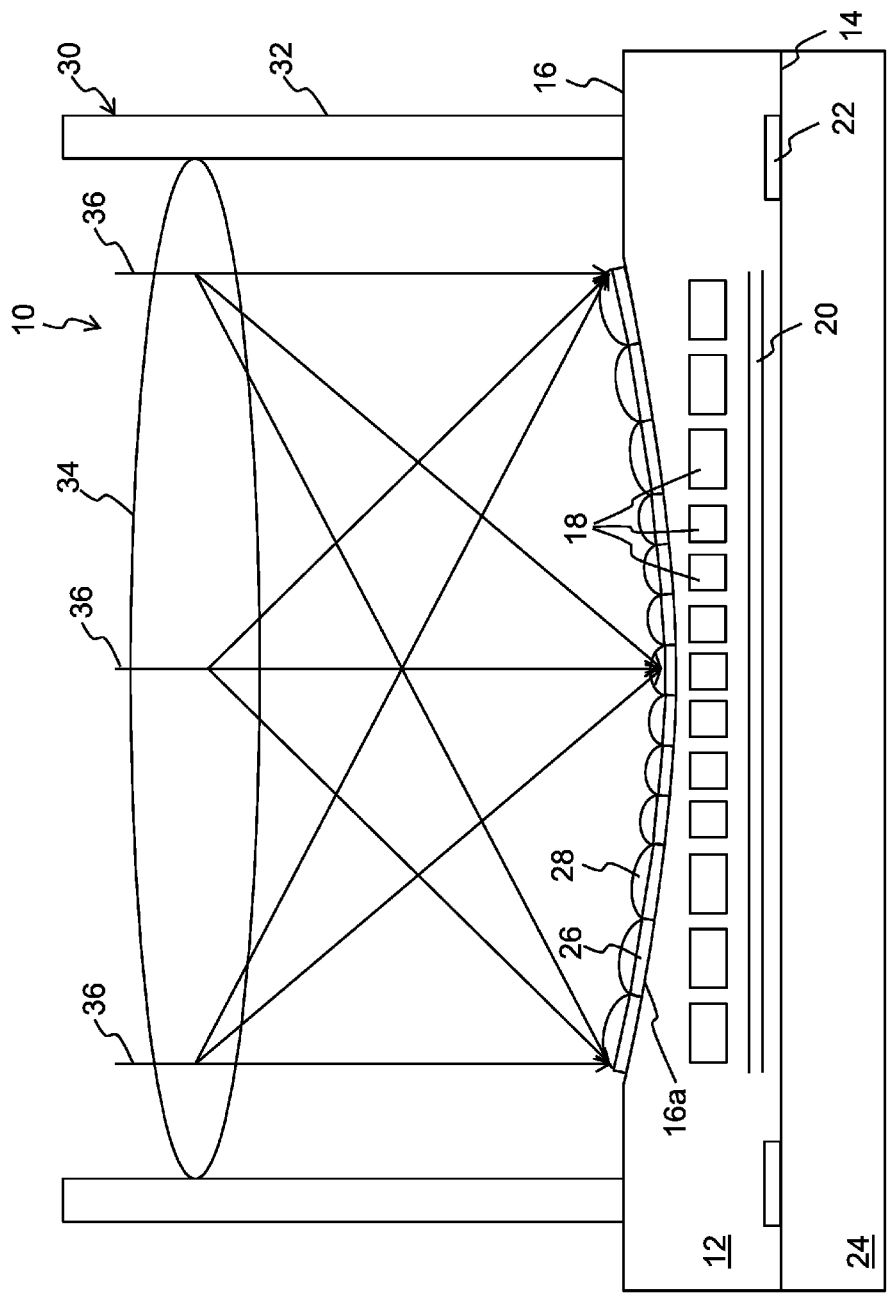

Color filters 26 and/or other optical enhancement layer(s) such as an anti-reflective layer, quantum dots and etc. can be deposited on the back surface portion 16a over the imaging area of the photo detectors 18. Micro lenses are then formed on the color filters 26 using standard manufacturing techniques such lithography and etching. Collectively, these components can be referred to as light manipulation components. The resulting structure is shown in FIG. 3D.

A lens assembly 30 is then mounted to the substrate 12, and includes a housing 32 in which one or more lenses 34 are housed. The lens(es) 34 focus incoming light 36 down to a focus plane having a small curvature and position that match the curved positioning of the micro lenses/filters 28/26 and/or substrate back surface portion 16a. The curved concave shape of the back surface portion 16a eliminations the need for any field flattener lens and eliminates distortions and other optical aberrations without requiring additional optical elements above the image sensor. Additionally, the portion of the substrate 12 between the photo detectors 18 and the back surface 16 is thicker for the photo detectors at the periphery of the array, which improves the quantum absorption for these detectors. This configuration allows the image sensor 10 to be closer to the lens(es) 34. By varying the lateral sizes of the photo detectors 18, the color filters 26 and the micro lenses 28 as a function of distance from the center of the sensor (which is optional), zoom in and zoom out capabilities, quantum efficiency and many other aspect of the imaging process can be improved.

Figure 4:
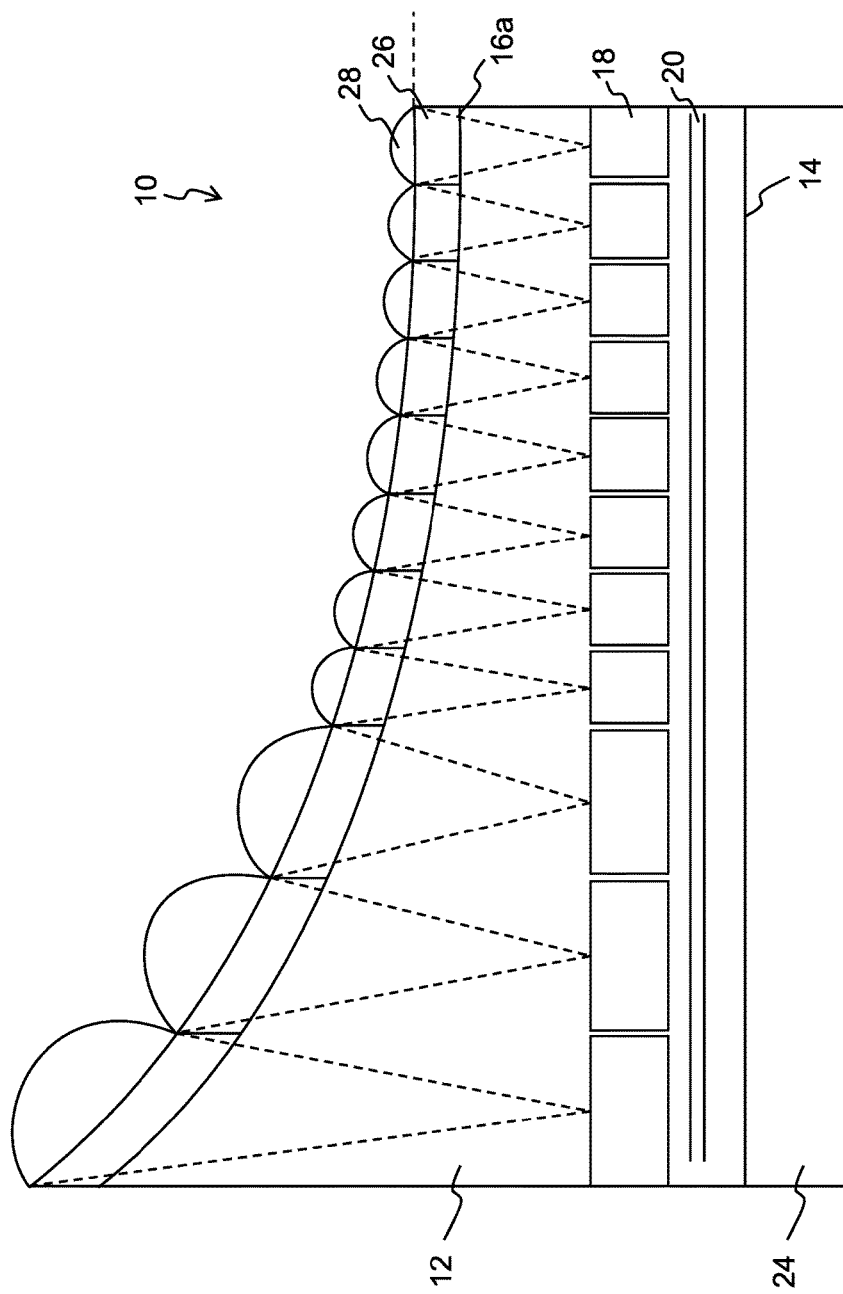
FIG. 4 is a side cross sectional view showing the focusing of light by the micro lenses of the image sensor.
Figure 5:
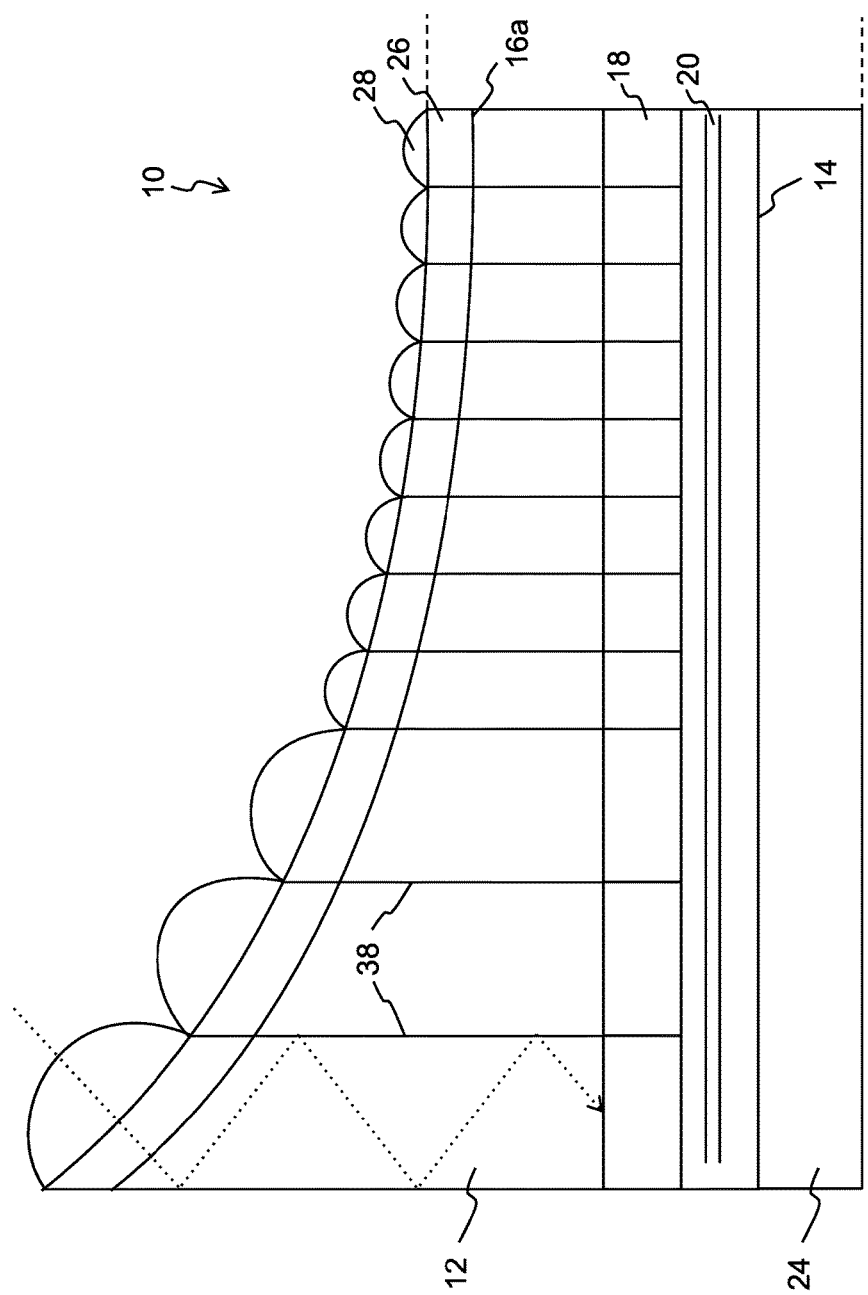
FIG. 5 is a side cross sectional view showing an alternate embodiment of the image sensor.

FIG. 4 illustrates how each microlens 28 focuses incoming light through the back surface portion 16a, through the material of substrate 12, and onto the respective photo detector 18. FIG. 5 illustrates an alternate embodiment, where vertically extending light shielding material layers 38 are formed in the substrate 12 over the photo detectors 18, creating lightwells directly over the photo detectors 18. For any light entering through a particular micro lens 28, the light shield material 38 reflects the incoming light so it reaches the photo detector 18 for that micro lens 18 (i.e. to prevent cross talk between the photo detectors).

Figure 6:
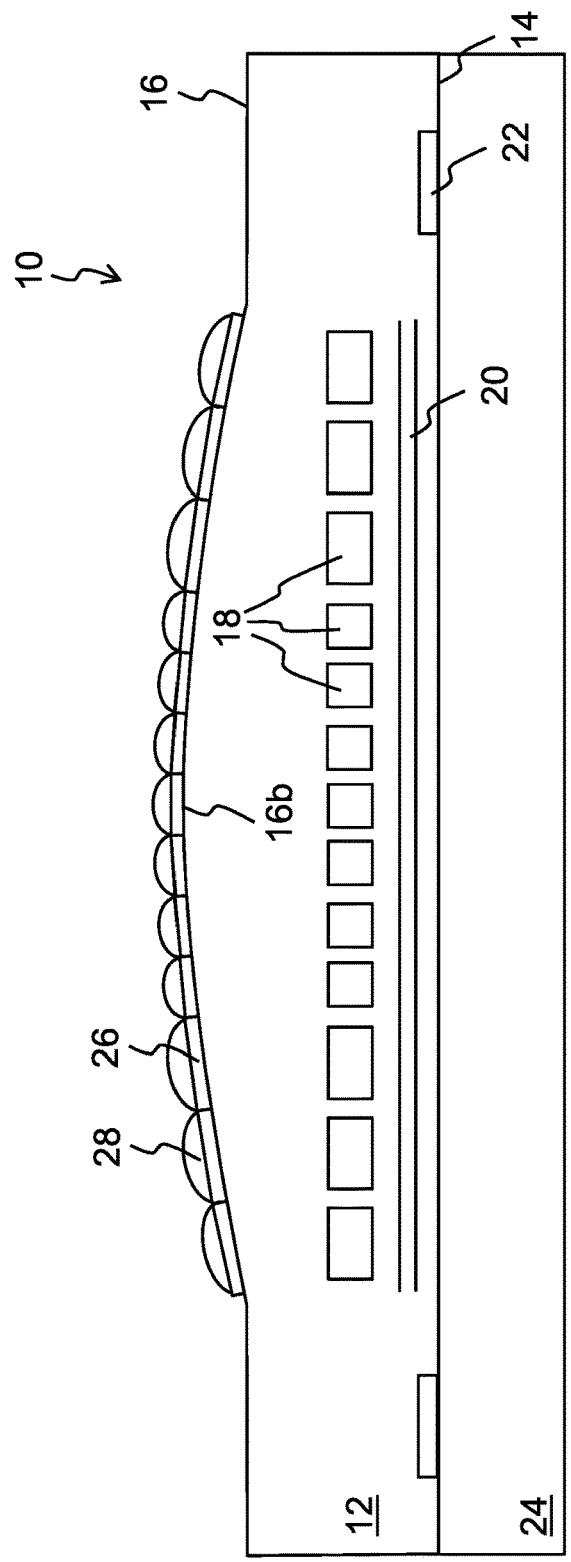
FIG. 6 is a side cross sectional view showing an alternate embodiment of the image sensor.

FIG. 6 illustrates another embodiment, where curved portion 16b of back surface 16 is convex shape instead of a concave shape. The convex shape can provide a wide-angle view. Moreover, the interfacing structure for this embodiment can simplify the lens design.

Figure 7:
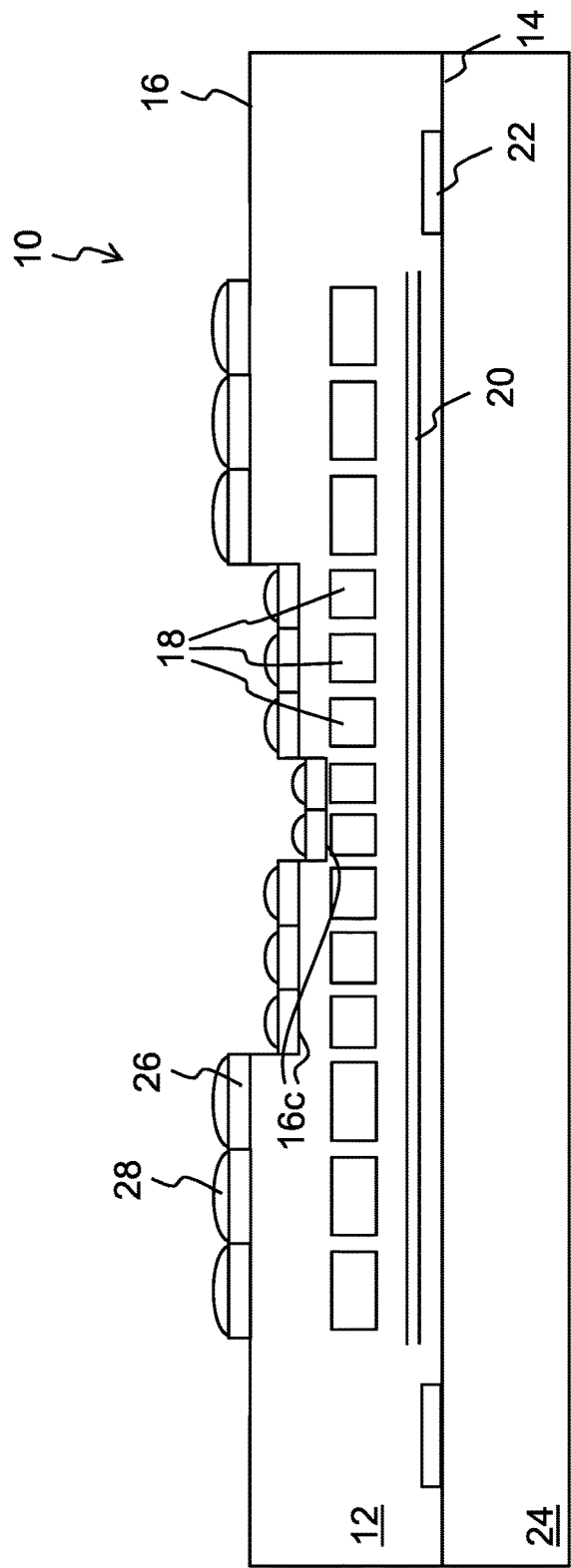
FIG. 7 is a side cross sectional view showing an alternate embodiment of the image sensor.
Figure 8:
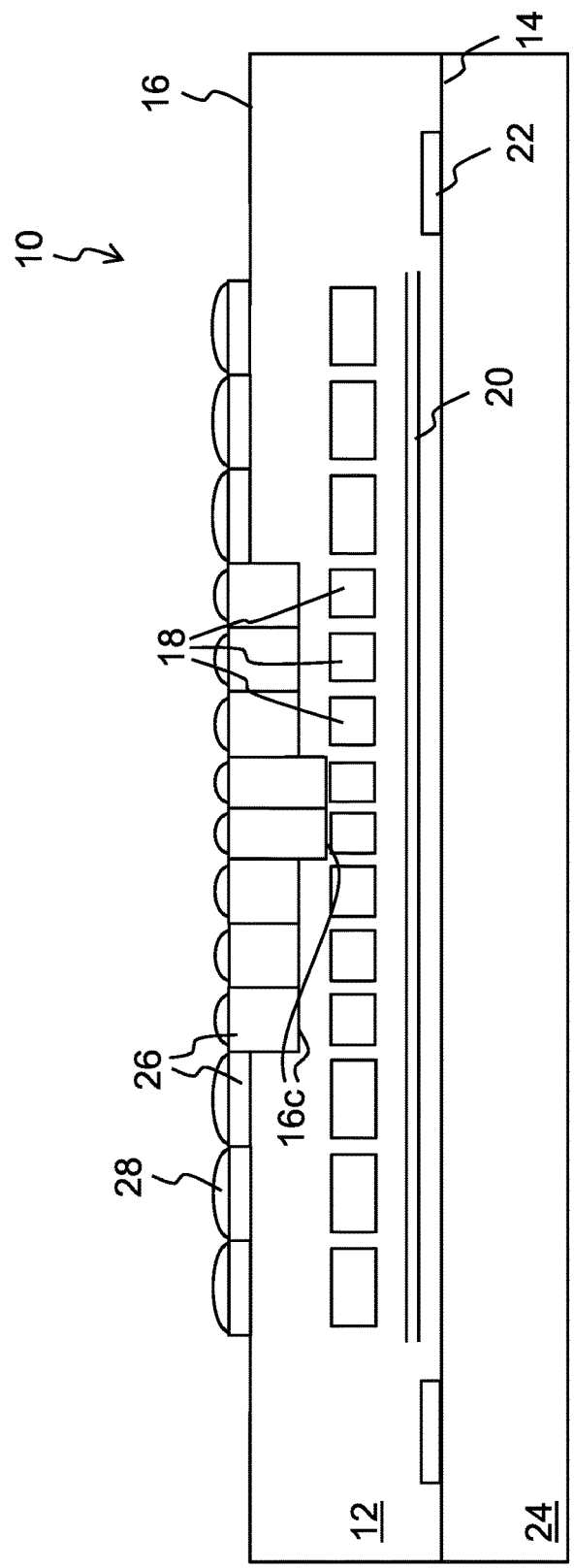
FIG. 8 is a side cross sectional view showing an alternate embodiment of the image sensor.

FIG. 7 illustrates another embodiment, where the back surface 16 includes recessed steps 16c relative to the rest of surface 16 instead of a curved shape. The depth of the steps 16c relative to the rest of surface 16 can roughly track the curvature of the focus plane of the lens(es). Additionally or alternatively, the depth of the steps 16c relative to the rest of surface 16 can correlate with the lateral sizes of the photo detectors 18 (i.e. the distance between the photo detectors and the back surface 16 of substrate 12 varies with varying lateral sizes of the photo detectors). For example, as shown in FIG. 7, the larger the photo detector lateral size, the further away the photo detector is from the back surface 16 (i.e. there is more substrate material over the photo detector and thus more of that material through which light must traverse, for photo detectors with larger lateral sizes). The recessed steps 16c can be formed into the back surface 16 using photo lithographic etch techniques known the art. The stepped structure will help prevent cross talk between larger pixels that are located on the periphery and the smaller pixels in the center of the sensor (located on the recessed step). Moreover, this configuration enables thinner color filters for better light sensitivity in the peripheral areas of the sensor, and thicker color filters in the center of the sensor, without the heights of the micro lenses mounted thereto being recessed by the same amount or at all, as shown in FIG. 8.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the image sensor assembly. Single layers of material could be formed as multiple layers of such or similar materials, and vice versa. Lastly, while the back surface 16 has been shown with a curved concave shape, a curved convex shape or a stepped shape, the back surface 16 could include a combination of two or more of these or any other appropriate non-planar shapes that are compatible with the optical system focusing light onto the sensor.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/ elements therebetween, as well as forming the element indirectly on the substrate with one or more intermediate materials/elements therebetween.

What is claimed is:

1. An image sensor comprising:
   a substrate having front and back surfaces;
   a plurality of photo detectors formed adjacent the front surface and disposed in a single plane;
   a plurality of contact pads at the front surface and electrically coupled to the photo detectors;
   a plurality of light manipulation components disposed on a portion of the back surface;
   wherein the photo detectors are configured to generate electrical signals in response to light incident through the light manipulation components and through the portion of the back surface;
   wherein the portion of the back surface has a curved convex or curved concave shape such that an amount of the substrate between the back surface and photo detectors adjacent a center of the plurality of photo detectors is different than an amount of the substrate between the back surface and photo detectors adjacent a periphery of the plurality of photo detectors.

2. The image sensor of claim 1, further comprising:
   circuitry adjacent the front surface and electrically coupled between the plurality of photo detectors and the plurality of contact pads, wherein the circuitry is disposed in a single plane.

3. The image sensor of claim 1, further comprising:
   a second substrate attached to the front surface.

4. The image sensor of claim 1, wherein the light manipulation components comprise color filters.

5. The image sensor of claim 1, wherein the light manipulation components comprise micro lenses.

6. The image sensor of claim 1, wherein the light manipulation components comprise:
   color filters mounted directly on the portion of the back surface, and
   micro lenses mounted directly on the color filters.

7. The image sensor of claim 1, further comprising:
   a lens assembly that includes:
   a housing mounted on the back surface, and
   one or more lenses in the housing and positioned for focusing light onto the plurality of light manipulation components.

8. The image sensor of claim 7, wherein the one or more lenses have a curved focal plane positioned at the plurality of the light manipulation components or at the portion of the back surface.

9. The image sensor of claim 8, wherein a shape of the curved focal plane and the curved convex or curved concave shape of the portion of the back surface are the same.

10. The image sensor of claim 1, further comprising:
    a plurality of light shielding material layers each extending from the back surface to one of the optical detectors and configured to guide incoming light from the back surface to the one optical detector by reflection.

11. The image sensor of claim 1, wherein:
    a first sub-plurality of the photo detectors have a first lateral size;
    a second sub-plurality of the photo detectors have a second lateral size; and
    the first size is smaller than the second size.

12. The image sensor of claim 11, wherein the first sub-plurality of the photo detectors are disposed closer to the back surface than the second sub-plurality of the photo detectors.

* * * * *